United States Patent
Sakayori et al.

(10) Patent No.: US 6,709,988 B2
(45) Date of Patent: Mar. 23, 2004

(54) PRODUCTION PROCESS OF ELECTRONIC COMPONENT USING WET ETCHING, ELECTRONIC COMPONENT, AND SUSPENSION FOR HARD DISK

(75) Inventors: Katsuya Sakayori, Shinjuku-ku (JP); Terutoshi Momose, Shinjuku-ku (JP); Tomoko Togashi, Shinjuku-ku (JP); Shigeki Kawano, Shinjuku-ku (JP); Hiroko Amasaki, Shinjuku-ku (JP); Michiaki Uchiyama, Shinjuku-ku (JP); Hiroshi Yagi, Shinjuku-ku (JP)

(73) Assignee: Dai Nippon Printing Co., Ltd. (JP)

( * ) Notice: Subject to any disclaimer, the term of this patent is extended or adjusted under 35 U.S.C. 154(b) by 146 days.

(21) Appl. No.: 10/107,801

(22) Filed: Mar. 28, 2002

(65) Prior Publication Data

US 2003/0052078 A1 Mar. 20, 2003

(30) Foreign Application Priority Data

Mar. 29, 2001 (JP) ........................... 2001-097437

(51) Int. Cl.7 ............................................. H01L 21/302
(52) U.S. Cl. .......................... 438/745; 216/13; 438/756
(58) Field of Search ................................. 438/754, 745, 438/756, 757; 216/13, 17

(56) References Cited

U.S. PATENT DOCUMENTS

| | | | | |
|---|---|---|---|---|
| 4,358,479 A | * | 11/1982 | Canestaro et al. | 427/98 |
| 5,429,709 A | * | 7/1995 | Mizutani et al. | 216/13 |
| 6,468,439 B1 | * | 10/2002 | Whitehurst et al. | 216/95 |
| 6,533,950 B1 | * | 3/2003 | Shum et al. | 216/13 |
| 6,596,184 B1 | * | 7/2003 | Shum et al. | 216/13 |

* cited by examiner

Primary Examiner—Kin-Chan Chen
(74) Attorney, Agent, or Firm—Parkhurst & Wendel, L.L.P.

(57) ABSTRACT

The present invention relates to a production process which, in the production of an electronic component by wet etching of an insulating layer in a laminate, is low in cost, does not use any organic solvent, which poses a problem of waste treatment. The production process of an electronic component comprises the steps of: wet etching a laminate of conductive inorganic material layer—insulating layer—conductive inorganic material layer or a laminate of conductive inorganic material layer—insulating layer to pattern the conductive inorganic material layer; and then performing wet etching to pattern the insulating layer. The patterning of the insulating layer by wet etching is carried out in a continuous form using a dry film resist; and, the dry film resist is laminated by roll pressing onto the laminate under a reduced pressure of not more than 80 KPa.

25 Claims, 2 Drawing Sheets

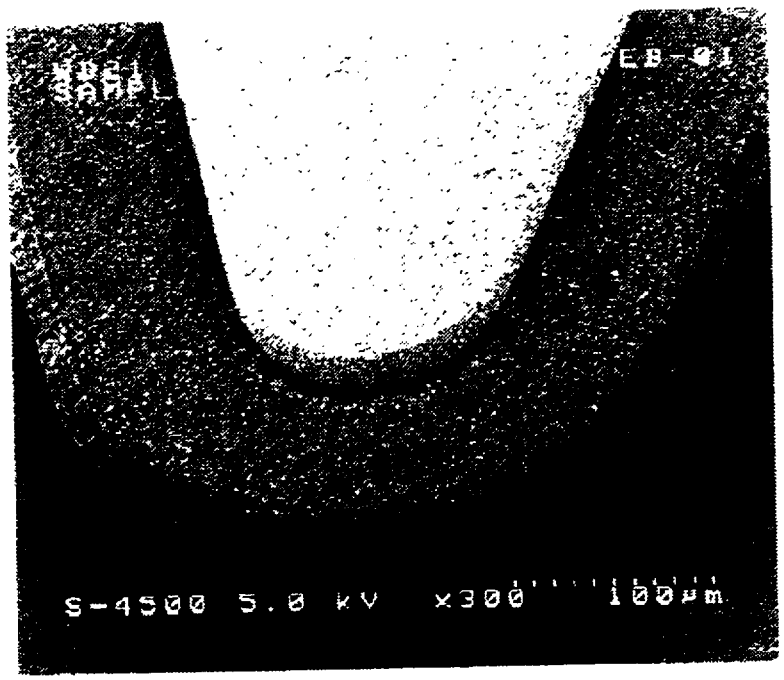
F I G. 2
F I G. 3

PRODUCTION PROCESS OF ELECTRONIC COMPONENT USING WET ETCHING, ELECTRONIC COMPONENT, AND SUSPENSION FOR HARD DISK

TECHNICAL FIELD

The present invention relates to a process for producing an electronic component, comprising the steps of providing a laminate having a layer construction of a conductive inorganic material layer—insulating layer—conductive inorganic material layer or a layer construction of conductive inorganic material layer—insulating layer, in which the insulating layer can be patterned by wet process, and wet etching the insulating layer to pattern the insulating layer, an electronic component per se produced by said process, and a suspension for a hard disk drive.

BACKGROUND ART

In recent years, rapid development of semiconductor technology has led to rapid progress of a reduction in size of semiconductor packages, the adoption of multipin, the adoption of fine pitch, minimization of electronic components and the like. That is, the semiconductor field has entered the so-called "age of high density packaging." Regarding printed wiring boards, the above tendency has also led to a change from single side wiring to double side wiring and, in addition, the adoption of a multilayer structure and a thickness reduction (Iwata and Harazono, "Denshi Zairyo (Electronic Material)," 35 (10), 53 (1996)).

A pattern formation method used in the formation of wiring and circuits in such electronic components comprises etching a conductive inorganic material layer on a substrate in a layer construction of conductive inorganic material layer (mainly metal layer)—insulating layer—conductive inorganic material layer (mainly metal layer) with an acidic solution, such as a ferric chloride solution, to form wiring, then subjecting the insulating layer, for example, to dry etching such as plasma etching, or wet etching such as etching with hydrazine, to remove the insulating layer to form a desired shape for layer-to-layer continuity purposes (Japanese Patent Laid-Open No. 164084/1994), and connecting the wirings to each other, for example, through plating or electrically conductive paste. Another pattern formation method (Proceedings of the 7th Symposium of Japan Institute of Electronics Packaging, issued in 1999) comprises providing an insulating layer in a desired form using a photosensitive polyimide (Japanese Patent Laid-Open No. 168441/1992) or the like and then plating gaps to form wiring.

In recent years, for electrical appliances, particularly personal computers, there is a tendency toward lower prices. For members, components and the like used in them as well, there is a tendency toward lower prices. Therefore, how to produce electronic components at low cost is a great issue.

At the present time, rapid expansion of production of personal computers has led to increased production of hard disk drives incorporated in the personal computers. A component, in the hard disk drive, called a "suspension," which supports a head for reading magnetism, is being shifted in its main products from one, wherein copper wiring is connected to a stainless steel plate spring, to one called a "wireless suspension" comprising copper wiring which has been connected directly to a stainless steel plate spring, from the viewpoint of coping with the size reduction.

The above wireless suspension is mainly prepared using a three-layer material of conductive inorganic material layer (mainly metal layer)—insulating layer—conductive inorganic material layer (mainly metal layer). An example of the layer construction of the three-layer material is such that a copper alloy foil is stacked on one side of an insulating layer and a stainless steel foil is stacked on the other side of the insulating layer. The wireless suspension is a member, which is scanned on a disk being rotated at a high speed, and, thus, fine vibration is applied to the wireless suspension. For this reason, the adhesive strength of wiring (conductive inorganic material layer) to the insulating layer is very important, and the wireless suspension should satisfy strict specifications. Since hard disks are devices for recording information thereon, a high level of data read/write reliability is required and strict specifications should also be satisfied for the adhesive strength of wiring and useless materials, such as dust, and outgas produced from the suspension.

In the laminate such as the three-layer material used in electronic components, in general, in order to render the coefficient of thermal expansion of the conductive inorganic material layer and the coefficient of thermal expansion of the insulating layer identical to each other for preventing the warpage of the substrate, a low-expansion insulating layer, particularly a low-expansion polyimide, is in many cases included. In the laminate in which only a low-expansion polyimide is used in the insulating layer, polyimide films, for example, KAPTON (tradename; manufactured by Du Pont-Toray Co., Ltd.), Upilex (tradename; manufactured by Ube Industries, Ltd.), and APIKAL (tradename; manufactured by Kanegafuchi Chemical Ind. Co., Ltd.), are used as the low-expansion polyimide. A metal layer (mainly copper) is formed, for example, by sputtering or electroless plating on the surface of the low-expansion polyimide film, and, thereafter, the thickness of the conductor layer is increased by electroplating (hereinafter referred to as "type-I laminate"). Another type of laminate is such that an insulator having a three-layer structure, wherein a layer of an adhesive (for example, an epoxy adhesive) other than polyimide is formed on the surface of a low-expansion polyimide, that is, having a layer construction of adhesive other than polyimide—low-expansion polyimide—adhesive other than polyimide, is provided and a conductor foil is adhered to the insulating layer by thermocompression bonding (hereinafter referred to as "type-II laminate"). A further type of laminate is such that an insulator having a three-layer structure, wherein an adhesive polyimide layer is formed on the surface of a low-expansion polyimide, that is, having a layer construction of adhesive polyimide—low-expansion polyimide—adhesive polyimide, is provided and a conductor foil is adhered to the insulating layer by thermocompression bonding (hereinafter referred to as "type-III laminate").

In the type-I laminate, since the insulating layer is formed of a polyimide having a single composition, the warpage is less likely to occur. Further, a thin metal layer can be formed. Therefore, this is advantageous for the formation of fine wiring. On the other hand, in the type-II laminate and the type-III laminate, since the conductor layer is formed by thermocompression bonding, the conductor layer can be selected from various types. For example, the preparation of a laminate using a rolled copper foil, a stainless steel foil or the like is possible. The type-II laminate advantageously has good adhesion. For the type-III laminate, since the adhesive layer is formed of highly heat-resistant polyimide, the heat resistance is advantageously good. Further, both the type-II and type-III laminates have an additional advantage that the thickness of the metal layer can be increased.

Since spring properties are required of the wireless suspension, a stainless steel foil is in many cases used as the metal layer. An example of the laminate structure is copper foil—adhesive polyimide—low-expansion polyimide—adhesive polyimide—stainless steel. In the conventional wireless suspension, since the etching area of the insulating layer is large, instead of laser beam etching, plasma etching, which belongs to the same category of process, i.e., dry process, is mainly used for patterning of the insulating layer. In the plasma etching, however, the etching rate is low, and, thus, the time necessary for etching is long. Further, since sheet-by-sheet production is adopted, the productivity is low. Moreover, the apparatus for plasma etching is so expensive that the production cost is disadvantageously very high.

For the above reason, patterning of the insulating layer by a wet process, which is high in etching rate and thus is high in productivity and can realize low apparatus cost, has been desired in the art.

Also in electronic components, such as flexible printed boards or multilayer substrate, wherein a hole is formed by laser beams for providing continuity between layers in the multilayer substrate followed by pattern drawing in a mold into a desired form, when the wet etching technique is used, the step of hole formation and the step of pattern drawing can be simultaneously carried out. In addition, a fine shape, which cannot be formed in the mold, can be formed by wet etching. Therefore, patterning of the insulating layer by the wet process has also been desired in each field of electronic components.

For the type-II laminate, the use of an epoxy adhesive poses a problem that the solvent resistant is so high that wet etching cannot be carried out at all.

For the type-III laminate, due to a significant difference in etching properties between the adhesive polyimide layer and the low-expansion polyimide layer, the sectional form after etching is not sharp, and this makes it substantially difficult to prepare electronic components by wet etching.

For the type-I laminate, in some cases, wet etching is adopted. Since, however, the conductive inorganic material layer is formed by sputtering or the like, a metal is collided at a high speed against the surface of the polyimide. As a result, the metal bites into the surface layer, as well as into the inside of the polyimide layer. This somewhat denatures the polyimide in the surface layer. The adhesion between the insulating layer and the conductive inorganic material layer in the type-I laminate relies mainly upon a chemical bond or a bond derived from chemical interaction between the conductive inorganic material layer and the insulating layer. Therefore, the affinity of the conductive inorganic material layer for the insulating layer is high. This poses a problem that, when the type-I laminate is wet etched, the insulating layer in its denatured portion located at the interface of the conductive inorganic material layer and the insulating layer remains unetched, resulting in pattern defects.

On the other hand, in the laminate prepared by integrating the conductive inorganic material layer with the insulating layer by pressing, as compared with the chemical bond or chemical interaction, the anchor effect attained by concaves and convexes on the surface of the conductive inorganic material layer more greatly contributes to the adhesive strength. Therefore, an unfavorable phenomenon, wherein a portion to be etched remains unetched, is less likely to occur. As described above, in the production of the laminate by pressing, since the degree of freedom in the selection of the conductive inorganic material layer is large, products, which could not have been produced in the case of the formation of the conductive inorganic material layer by sputtering, can also be produced.

Further, unlike plasma etching, the wet etching does not require a high level of vacuum process. Therefore, a nonstop production line process can be easily applied by continuously feeding a continuous sheet of a laminate as a starting material, and, advantageously, the productivity can be significantly improved over the productivity of the plasma etching.

Polyimides generally have poor solubility in solvents. Since, however, they are decomposed by a hydrazine or alkali solution, various studies have hitherto been made on wet etching of polyimide films with a chemical liquid. For example, Japanese Patent Laid-Open No. 4577/1975 discloses a production process of a wiring structure using hydrazine and ammonia. Japanese Patent Laid-Open No. 103531/1983 discloses a method for etching a polyimide film with an inorganic basic aqueous solution. Japanese Patent Laid-open No. 65727/1982 discloses a method for etching a polyimide with an aliphatic diamine. Other methods for wet etching a polyimide disclosed up to now are such that a chemical liquid prepared by mixing water or an organic polar solvent with hydrazine/inorganic alkali/organic alkali/aliphatic amine (diamine) /aliphatic alcohol as a solvent is used (for example, Japanese Patent Laid-Open Nos. 74041/1983, 96632/1983, 101228/1991, 190610/1993, 202206/1993, and 157560/1995).

Hydrazine as a component for decomposing the polyimide, however, is highly toxic and thus is unsuitable for use in production process. For this reason, in proposals in recent years, in many cases, an etching solution comprising an inorganic basic aqueous solution and various additives added thereto is used.

Conventional methods for etching a polyimide film by wet etching to form a pattern include: a method wherein a metal is used in a pattern mask (Japanese Patent Laid-Open No. 283486/1993); a method wherein a solvent development-solvent separation-type negative-working liquid resist is used (Japanese Patent Laid-Open No. 301981/1993); and a method wherein a solvent development-solvent separation-type positive-working liquid resist is used (Japanese Patent Laid-Open Nos. 27464/1976, 49068/1978, 49068/1978, 65727/1982, and 74041/1983). These conventional methods for wet etching a polyimide film to form a pattern are effective in shorting the time necessary for patterning of the insulating layer.

The laminate using a polyimide as an insulating layer is in many cases thin and thus has low rigidity. Therefore, this laminate is disadvantageously inferior in handleability to conventional rigid glass epoxy substrates or the like. This is a serious limitation on process design. For this reason, if possible, a continuous production line by continuously feeding a continuous sheet is desired rather than sheet-by-sheet processing.

In the above method wherein the polyimide is etched using the metal layer as a pattern mask, however, after the metal layer is etched to form a final pattern shape of the insulating layer followed by etching of the insulating layer using the etched metal layer as a pattern mask, the metal layer should be further re-patterned by etching into a desired wiring shape. That is, in this method, the metal should be etched twice in total, and, in addition, the etching liquid comes into contact with the metal at the time of etching of the polyimide. This is causative of a deterioration in the metal layer.

Further, when a resist pattern is prepared using a solvent development-separation-type liquid resist, an organic solvent is necessary for the developing solution and the separating solution. Therefore, a load on the environment is large, and expenses for wastewater treatment are necessary. Moreover, when the solvent development-separation-type liquid resist is used, it is difficult to stably form a coating having even thickness for the following reason. Specifically, in the production of electronic components such as suspensions for hard disk drives, a liquid resist is coated onto a substrate having low rigidity, and the coating is dried. In this case, it is difficult to form a coating having even thickness. Patterning with high accuracy is required of electronic components such as suspensions for hard disk drives. In this case, when a resist film is formed by coating, very close control in the step of coating/drying is necessary for forming a coating having even thickness with high accuracy.

In continuously etching a continuous laminate having the three-layer structure, lamination by means of a flat press device in continuous lamination of the dry film is very disadvantageous. In this case, the use of a roll laminator is considered effective for coping with the continuous feed of the laminate sheet as the starting material. In the case of etching of the insulating layer by continuous feed of the laminate sheet, however, lamination of a dry film resist under atmospheric pressure onto the substrate with the metal being patterned poses a problem that, at the time of contact bonding, air bubbles are included into portions between the dry film resist and the laminate sheet, particularly in the edges of the patterned metal. Since air bubbles lead to etching failure, the inclusion of air bubbles should be prevented.

Basically, it is confirmed that, in the case of a basic aqueous solution developable-basic aqueous solution separable resist, when a polyimide etching liquid containing an inorganic alkali is used, the resist is disadvantageously separated from the laminate as a substrate by the action of an alkali component in the etching liquid. For this reason, it was thought that the realization of the production of electronic components by etching of the laminate using the above resist was difficult.

In techniques for wet etching of polyimides which are currently known in the art, a laminate comprising an insulating layer having one polyimide layer is mainly used. There are a few reports on examples of wet etching of a laminate of a plurality of polyimide layers (Japanese Patent Laid-Open No. 164084/1994). The reason for this is that, since the plurality of polyimide layers put on top of each other are different from each other in etching properties, a good sectional form cannot be disadvantageously provided by wet etching.

In the suspension for a hard disk, stainless steel as the spring material is an essential element. Therefore, the suspension is produced using a laminate produced by sandwiching a low-expansion polyimide film having on its both sides an adhesive resin layer between a conductor foil and a stainless steel foil and pressing the assembly, or a laminate produced by putting a plurality of polyimide layers on top of a stainless steel foil and further forming a conductor layer thereon by thermocompression bonding. Therefore, the production of the suspension faces the above various problems, and, for this reason, the preparation of a suspension by patterning of the polyimide layer by wet etching could not have been realized.

DISCLOSURE OF THE INVENTION

Accordingly, it is an object of the present invention to eliminate the above problems of the prior art and to provide a production process which, in the production of an electronic component by wet etching of an insulating layer in a continuous laminate of conductive inorganic material layer—insulating layer—conductive inorganic material layer or a continuous laminate of conductive inorganic material layer—insulating layer, wet etches a continuous sheet or a pseudo-continuous sheet at low cost without the use of any organic solvent, which poses a problem of waste treatment, in a continuous feed, continuous production line to produce an electronic component with high accuracy and with significantly increased productivity.

It is a subordinate object of the present invention to provide a production process of an electronic component which can realize single etching of the conductive inorganic material layer to prevent a deterioration in the conductive inorganic material layer, can eliminate the need to use any organic solvent, which imposes a large burden on the environment, as a chemical liquid for the development and separation of the resist, and enables the application of wet etching using a resist to an insulating layer having a single layer structure or a laminate structure of two or more insulation unit layers.

It is another subordinate object of the present invention to provide a production process of an electronic component that can provide a laminate which provides a good sectional form after wet etching with good etching accuracy, and to provide an electronic component and a suspension for a hard disk produced by said production process.

It is still another subordinate object of the present invention to enable wet etching of the laminate in the step of treatment using a dry film resist, that is, the step of development with an aqueous solution, particularly a basic aqueous solution and separation with a basic aqueous solution.

According to the present invention, there is provided a process for producing an electronic component, comprising the steps of: wet etching a laminate of conductive inorganic material layer—insulating layer—conductive inorganic material layer or a laminate of conductive inorganic material layer—insulating layer to pattern the conductive inorganic material layer; and then performing wet etching to pattern the insulating layer, wherein: the insulating layer in the laminate is wet etchable and has a single-layer structure or a laminate structure of two or more insulation unit layers; after the patterning of the conductive inorganic material layer in the laminate, the patterning of the insulating layer by wet etching is carried out in a continuous form in a continuous feed, continuous production line using a dry film resist; and, in patterning the insulating layer using the dry film, the dry film resist is laminated by roll pressing onto the laminate under a reduced pressure of not more than 80 KPa.

In the production process of an electronic component according to the present invention, in roll pressing the dry film resist onto the laminate under reduced pressure, this step is continuously carried out. Therefore, tension is always applied to the laminate, and this can solve the problem of warpage after the lamination.

In the production process of an electronic component according to the present invention, since the laminate as a continuous sheet is wet etched in a continuous form in a continuous feed, continuous production line, electronic components can be produced with high accuracy and with significantly enhanced productivity.

In a preferred embodiment of the production process of an electronic component according to the present invention, the dry film resist is developed with an aqueous solution, particularly a basic aqueous solution and is separated with an aqueous solution, particularly a basic aqueous solution.

The development with the basic aqueous solution and the separation with the basic aqueous solution can solve the problem of the treatment of the used organic solvent.

As a result of studies on the resistance of various dry film resist to various etching liquids, it was found that, for basic aqueous solution development-basic aqueous solution separation-type dry film resists, when etching conditions, the thickness of dry film resists and the like are optimized as described later, some materials for dry films are resistant to etching liquids. Further, it was found that, likewise, aqueous lactic acid solution development-aqueous lactic acid solution separation-type dry film resists, which are dry film resists other than the basic aqueous solution development-basic aqueous solution separation-type dry film resists, are resistant to etching liquids.

In forming a pattern of the insulating layer in the laminate having the above construction in a sheet-by-sheet form, the lamination of a dry film resist onto the substrate, after the patterning of the metal, by means of a roll laminator causes the warpage of the laminate because the laminate per se is thin and has poor rigidity. The warpage of the laminate poses a problem that the misalignment with the mask at the time of exposure to the resist is significant. The wet etching of the insulating layer is characterized in that the dimensional accuracy of the patterning is higher than that in plasma etching which is an existing dry process. Therefore, in order to reproduce the insulating layer pattern in the laminate with high accuracy, the misalignment is a severe problem, and solving this problem is very important for establishing the wet etching process. According to the construction of the present invention, the laminate is treated in a continuous form in a continuous feed, continuous production line. Therefore, tension is applied to the continuous laminate, and, in the lamination of the dry film resist, the dry film resist is laminated by roll pressing under reduced pressure. This can prevent the occurrence of warpage.

The effect of preventing the inclusion of air bubbles at the time of the lamination of the dry film resist onto the laminate according to the present invention will be described. For the continuous laminate sheet having the above layer construction, even when the flatness is somewhat sacrificed, the feed of the laminate to a continuous production line to perform continuous treatment is important for enhancing the production efficiency. Therefore, for the continuous laminate sheet, after the etching of the inorganic material layer, when the insulating layer is wet etched using a dry film resist, since wiring of the conductive inorganic material layer is provided on the insulating layer, that is, since the wiring of the conductive inorganic material layer is the form of concaves and convexes, air bubbles are disadvantageously included in portions between the edges of the concaves or convexes and the dry film resist. In the present invention, as described above, in the lamination of the dry film resist, since the dry film resist is laminated by roll pressing under reduced pressure, the inclusion of air bubbles can be prevented.

Further, in the present invention, preferably, fine concaves and convexes are provided on the surface of the dry film resist. The formation of the air bubbles can be suppressed by laminating the dry film resist having concaves and convexes on its surface in such a manner that the concaves and convexes face the concave/convex side (that is, wiring side) of the conductive inorganic material layer. That is, the concaves and convexes form a place for escape of air bubbles to prevent the inclusion of air bubbles.

Further, in order to impart the above etching resistance of the dry film to the laminate, a method is preferably adopted wherein, after the laminate of the dry film resist is exposed and developed to form a pattern, treatment selected from ultraviolet light irradiation treatment, heat treatment, and a combination of ultraviolet light irradiation treatment with heat treatment is carried out to improve the resistance of the dry film resist to the etchant for the insulating layer.

Further, in order to develop an effect under the above conditions, the thickness of the insulating layer in the laminate is preferably 3 to 500 $\mu$m. When the thickness of the insulating layer is larger than 500 $\mu$m, the time necessary for etching is increased. In this case, since the dry film resist is dipped in the etching liquid for a long period of time, the shape of the dry film resist cannot be retained. On the other hand, when the thickness of the insulating layer is less than 3 $\mu$m, insulation reliability is lowered.

Further, in order to impart the etching resistance to the laminate, the thickness of the dry film resist is preferably 1.1 to 5 times that of one conductive inorganic material layer in the laminate as the starting material.

The time necessary for the wet etching of the insulating layer is suitably not less than 10 sec and not more than 30 min, preferably not less than 10 sec and not more than 15 min, more preferably not less than 10 sec and not more than 5 min. When the time necessary for the wet etching of the insulating layer is not less than 30 min, the productivity is poor.

Furthermore, in order to impart the etching resistance to the laminate, the temperature of the insulating layer at the time of wet etching is preferably not less than 10° C. and not more than 120° C.

At the present time, the dry film resist, which is developable and separable with a basic aqueous solution, is most widely used and thus is inexpensive. Therefore, the number of types is large, and the range of selection is wide. Further, since a large number of apparatuses usable in the step of development and separation are also commercially available, a desired apparatus is easily available at a low price. In the case of an inorganic basic aqueous solution, the wastewater treatment is easy, and, thus, as compared with the solvent development-solvent separation-type liquid resist, the cost necessary for the whole process can be significantly reduced.

The laminate according to the present invention has a good sectional form after wet etching and can be etched with high accuracy and thus is useful particularly for a suspension for a hard disk drive.

BRIEF DESCRIPTION OF THE DRAWINGS

FIG. 2 is an electron photomicrograph of a sample after the completion of etching with good results; and FIG. 3 is an electron photomicrograph of a sample wherein a copper alloy foil has been exposed and etching failure has occurred.

BEST MODE FOR CARRYING OUT THE INVENTION

Figure 1:
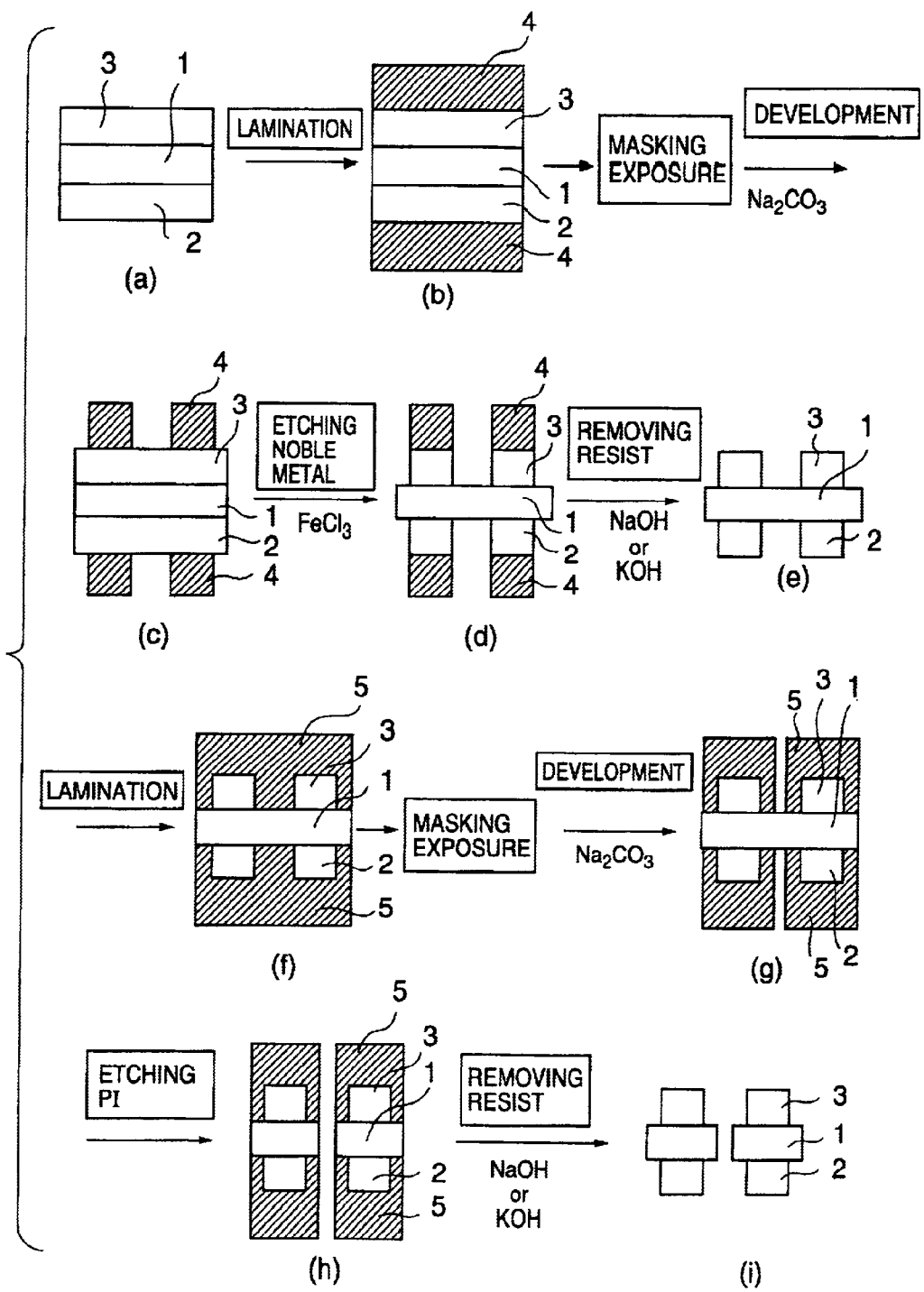
FIG. 1 is a process diagram illustrating a production process of an electronic component by wet etching using, as a starting material, a laminate comprising an insulating layer of a polyimide, a conductive inorganic material layer of copper provided on one side of the insulating layer, and a conductive inorganic material layer of SUS provided on the other side of the insulating layer.

Specific preferred embodiments of the production process of an electronic component according to the present invention will be described with reference to a process diagram, though the present invention is not limited to these preferred embodiments. FIG. 1 is a process diagram illustrating a production process of an electronic component by wet etching, wherein a laminate comprised of an insulating layer 1 of a polyimide, a conductive inorganic material layer 3 of copper provided on one side of the insulating layer 1, and a conductive inorganic material layer 2 of SUS provided on the other side of the insulating layer 1 is used as a starting material.

FIG. 1(a) shows the layer construction of a laminate in a continuous form as a starting material. A dry film resist 4 is laminated by roll pressing onto each of the conductive inorganic material layers 2, 3 located respectively on the top surface and the back surface of a laminate drawn out from the laminate in a roll form to prepare a laminate having a laminate structure shown in FIG. 1(b). At that time, a mask for bringing the conductive inorganic material layers 2, 3 to a desired pattern is put on the laminate, and the assembly is then exposed. Next, development with an aqueous $Na_2CO_3$ solution is carried out to form a resist pattern shown in FIG. 1(c). The conductive inorganic material layers 2, 3 are then etched with an aqueous $FeCl_3$ solution to form an etching pattern of the conductive inorganic material layers 2, 3 according to the resist pattern shown in FIG. 1(d). The resist is then dissolved in and separated by an aqueous NaOH solution or an aqueous KOH solution to form an etching pattern of the conductive inorganic material layers 2, 3 shown in FIG. 1(e). Next, a dry film resist 5 is laminated by roll pressing onto the conductive inorganic material layers 2, 3 located on the top surface and the back surface of the laminate shown in FIG. 1(e) to prepare a laminate having a laminate structure shown in FIG. 1(f). A mask for bringing the insulating layer 1 to a desired pattern is put on the laminate, and the assembly is exposed and is then developed with an aqueous $Na_2CO_3$ solution to form a resist pattern shown in FIG. 1(g). Next, the insulating layer 1 is etched with an aqueous basic solution to form an etching pattern of the insulating layer 1 according to the resist pattern shown in FIG. 1(h). Next, the resist is dissolved in and separated by an aqueous NaOH solution or an aqueous KOH solution to prepare an electronic component according to the present invention with an etching pattern being formed therein as shown in FIG. 1(i). Each of the above steps is carried out in such a state that a tension of 0.01 kgf/cm to 10 kgf/cm is applied to the laminate. When the tension is less than 0.01 kgf/cm, the laminate is sagged in transit, making it difficult to perform etching with high accuracy. On the other hand, a tension of not less than 10 kgf/cm causes the deformation of the laminate with the progress of wet etching of the insulating layer, and a tension of not less than 30 kgf/cm disadvantageously causes the deformation of the laminate per se.

In the present invention, the expression "in a continuous form in a continuous feed, continuous production line" means that at least steps ranging from the lamination of the dry film to exposure, development, and etching of the insulating layer are continuously carried out for a continuously or a pseudo-continuously fed laminate and, in this case, in each step, the laminate is not cut and is in a connected state. The expression "a pseudo-continuously fed laminate" means that, in a feed section in the production line, short-length laminates are fixed and joined as desired to each other or one another to prepare a continuous laminate sheet which is then continuously fed. An example of a method for joining short-length laminates together is such that the ends of the laminates are mutually overlapped with each other and are joined by locking means, such as a stapler, a clip, a screw, or coating of an adhesive. Therefore, there is no need to always feed the laminate as the starting material in the state of being wound in a roll form, and the steps ranging from the lamination of the dry film to exposure, development, and etching of the insulating layer can be carried out while joining short-length laminates in a pseudo manner in the production line.

Next, each constituent feature of the present invention will be described in detail.

Laminate

The laminate used in the present invention has a layer construction of conductive inorganic material layer—insulating layer—conductive inorganic material layer or a layer construction of insulating layer—conductive inorganic material layer. Here the conductive inorganic material layer used refers to a conductive material layer which is not organic. Examples of conductive inorganic material layers include a pure metal layer of copper, iron or the like, an alloy layer such as stainless steel, a material layer formed by treating the surface of the metal layer, a single crystal silicon layer, an inorganic semiconductor layer, and an metal oxide layer. When a conductive inorganic material layer is provided on both sides of the insulating layer, the conductive inorganic material layers may be the same or different. In particular, in the case of electronic components, copper, copper alloy, iron, nickel, stainless steel and the like are suitable. The conductive inorganic material layer preferably has a thickness in the range of 0.1 $\mu$m to 1 mm. In particular, when the conductive inorganic material layer is formed of a metal, the thickness of this layer is more preferably in the range of 0.1 $\mu$m to 200 $\mu$m.

When the electronic component produced by the production process of an electronic component according to the present invention is a suspension for a hard disk drive, there is no particular limitation so far as one of the conductive inorganic material layers in the laminate as the starting material is formed of stainless steel. From the viewpoint of spring properties required in the suspension or dimensional stability, however, SUS 304 is preferred. More preferred is SUS 304 which has been tension annealed at a temperature of 300° C. or above. The thickness of the stainless steel foil is preferably in the range of 10 to 70 $\mu$m, more preferably 15 to 30 $\mu$m.

For example, a copper foil or copper alloy foil having a thickness of 3 to 20 $\mu$m may be mentioned as the other conductive inorganic material layer in the laminate as the starting material. The copper alloy foil is an alloy foil formed of copper in combination with a dissimilar element such as nickel, silicon, zinc, tin, or beryllium and has a copper content of not less than 80%.

These stainless steel foil and copper alloy foil may be chemically or mechanically surface treated from the viewpoint of improving the adhesion or the like.

The insulating layer in the laminate may be formed of any material without particular limitation so far as the material has insulating properties. From the viewpoints of insulating properties and heat resistance in the form of a thin film, however, at least one layer of a polyimide resin is preferably included in the insulating layer. The insulating layer may be in the form of a laminate of a plurality of insulation unit layers, for improving the adhesion to the conductive inorganic material layer. For example, an adhesive insulating layer may be included. In this case, preferably all the layers constituting the insulating layer are formed of a polyimide from the viewpoints of heat resistance and insulating properties. Further, according to required properties, all of these layers may be different from each other or one another in composition, or alternatively a plurality of layers having an identical composition may be used. An example of the above construction is a laminate of stainless steel—adhesive polyimide A—low-expansion polyimide—adhesive polyimide B—copper. In this case, since the conductive inorganic material layers as adherends are different from each other, one of which is formed of stainless steel and the other is formed of copper, layers (adhesive polyimides A and B) constituting the insulating layer, which are different from each other in composition, are used for good adhesion to the respective adherends. The present invention, however, is not limited to this only.

Further, from the viewpoint of preventing the warpage of the substrate, preferably at least one of the layers constituting the insulting layer has a coefficient of thermal expansion (a coefficient of linear thermal expansion) which is relatively close to that of the conductive inorganic material layer (see Japanese Patent Laid-Open No. 157286/1985). The acceptable range of the difference in coefficient of thermal expansion is ±15 ppm. Further, since the conductive inorganic material generally has a coefficient of thermal expansion of not more than 30 ppm, the use of an insulating layer having a coefficient of thermal expansion of not more than 30 ppm is more preferred. When more fully preventing the warpage is desired, the total thickness of the layers having a coefficient of thermal expansion of not more than 30 ppm in the insulating layer is preferably not less than the half of the total thickness of all the layers constituting the insulating layer.

When the insulating layer in the laminate has a multilayer structure of a plurality of polyimide layers, the etching properties of the polyimide layers are particularly important. In the insulating layer in the laminate according to the present invention constituted by two or more insulation unit layers, the ratio of the etching rate of the insulation unit layer having a higher etching rate to the etching rate of the insulation unit layer having a lower etching rate at the time of the wet etching is preferably in the range of 6:1 to 1:1, more preferably in the range of 4:1 to 1:1. When the insulation unit layers falling within this etching rate ratio are selected, a good etching shape can be realized in the insulating layer. In this case, even in the laminate for a wireless suspension which has hitherto been required to satisfy strict specifications, wet etching can be carried out with high accuracy, and, as compared with dry etching, etching can be carried out in a shorter time with better productivity.

The total thickness of the layers constituting the insulating layer is preferably in the range of 3 to 500 μm. Further, from the viewpoint of productivity, the wet etching time is preferably 10 sec to 30 min. Wet etching within 15 min is further preferred. On the other hand, when the wet etching time is more than 30 min, since the etching liquid is strongly basic, the dry film resist is unfavorably separated at the time of etching, making it impossible to form a desired etching pattern. When the etching rate under wet etching conditions is large and the insulating layer can be etched by not less than 500 μm in 30 min, a thickness of the layers constituting the insulating layer of not less then 500 μm may be adopted. On the other hand, when the etching rate is small and etching of the thickness 500 μm cannot be realized in 30 min, the acceptable upper limit of the thickness of the insulating layer is such that the insulating layer can be etched in 30 min. More specifically, for example, when the etching rate of the insulating layer is 20 μm/min, the acceptable upper limit of the thickness of the insulating layer is 600 μm. When the etching rate of the insulating layer is 2 μm/min, the acceptable upper limit of the thickness of the insulating layer is 60 μm.

In the wet etching of the insulating layer, for example, in the case of etching of a polyimide as the insulating layer with a basic aqueous solution, an imide bond is reacted with hydroxide ions in the solution to cause ring opening and consequently to give polyamic acid. Even in this state, the solubility in the basic aqueous solution is higher than that of the polyimide in the basic aqueous solution. Further, the amide group in the amic acid is hyrolyzed by hydroxide ions to lower the molecular weight of the polymer, and this improves the solubility. When an easily hydrolyzable group is contained in the molecular chain, this site is sometimes hydrolyzed. In general, in the case of insulating layers having an identical structure produced under the same production conditions, the rate is approximately proportional to the number of times of collision of hydroxide ions against imide bond in the polyimide, and this thermodynamically exponentially increases with increasing the temperature.

According to this mechanism, in the case of a linear polymer, when the molecular weight is in a practically usable range, it is considered that the etching rate is not significantly influenced by the molecular weight. In fact, the above hypothesis is supported by data obtained by experiments conducted by the present inventors.

In the laminate as the starting material used in the present invention, the adhesive insulating layer constituting the insulating layer is mainly formed of a polyimide or a resin similar to the polyimide. However, the resin is not particularly limited to this only, and any resin may be used so far as the resin is heat resistant or has insulating properties (the resin usable herein is independent of whether or not imide bond is present). The adhesive polyimide in the present invention refers to a polyimide, which has an adhesive strength to an adherend of not less than 100 g/cm in a 90-degree peel test, and a thermoplastic polyimide is mainly used. However, the adhesive polyimide is not particularly limited to this only.

The laminate as the starting material used in the present invention may be produced by any method without particular limitation so far as the final layer construction of the laminate is the same, and the production method may be properly selected according to properties required of the contemplated product. Examples of production methods include: a method (cast method) wherein a solution of a material for the insulating layer is coated directly onto the conductive inorganic material layer to form one or more stacked layers as the insulating layer, another conductive inorganic material layer is laminated, and the assembly is then thermocompression bonded; a method (film method) wherein an adhesive insulating layer is formed on a previously provided core film as the insulating layer, a conductive inorganic material layer is laminated and thermocompression bonded onto the top surface and the back surface of the adhesive insulating layer; and a method wherein, after the formation of an adhesive insulating layer onto an insulation film, an conductive inorganic material layer is formed by vapor deposition, sputtering, plating or the like.

In the contemplated electronic component, when a conductive inorganic material layer, which cannot be formed by plating, such as a rolled copper foil or stainless steel is indispensable, the use of a laminate produced by a method, wherein conductive inorganic material layers are formed by thermocompression bonding, is preferred. When the conductive inorganic material layer should be very finely patterned in a wiring width of not more than 1 μm, the use of a laminate, in which a conductive inorganic material layer is thinly formed by sputtering or plating, is preferred.

The thickness of the whole laminate including the conductive inorganic material layers may vary depending upon contemplated applications. Preferably, however, the thickness of the whole laminate including the conductive inorganic material layers is in the range of 5 to 2000 μm. In particular, when all the conductive inorganic material layers in the laminate are formed of a metal, the thickness of the whole laminate including the conductive inorganic material layers is preferably in the range of 5 to 1000 μm, particularly preferably in the range of 5 to 500 μm.

In order to continuously feed a continuous or pseudo-continuous laminate to a continuous production line, the laminate should be not less than 10 m, and, from the viewpoint of preventing the warpage, the diameter of the core in the feed of the roll is preferably not less than 1 inch. For example, when laminate sheets are connected to each other or one another to prepare a continuous laminate sheet, the use of the core is not required.

Dry Film Resist

A material, which undergoes a change in solubility in a developing solution upon exposure to ultraviolet light (electromagnetic radiation), is used as the dry film resist in the present invention. The dry film resist refers to a solid film formed by molding a photosensitive resin composition which, upon the application of ultraviolet light (electromagnetic radiation) through an exposure mask having a desired pattern, can be patterned by utilizing the exposed portion and the unexposed portion. Dry film resists are classified into positive-working resists, wherein the exposed portion is eluted into the developing solution, and negative-working resists wherein the unexposed portion is eluted into the developing solution. In the present invention, any of the positive-working or negative-working resists may be used so far as the following property requirements are met.

The dry film resist in the present invention is preferably developable and separable with an aqueous solution, particularly a basic aqueous solution. The dry film resist, however, is not particularly limited so far as the resist is resistant to the etching liquid and can maintain the pattern shape during wet etching of the insulating layer. Dry film resists, which are developable and separable with a basic aqueous solution, include, for example, SUNFORT (tradename) series manufactured by Asahi Kasei Kogyo K.K.; and ALPHO (tradename) series and LAMINAR (tradename) series manufactured by Nichigo-Morton Co., Ltd. Further, commercially available lactic acid solution development-lactic acid solution separation type dry film resists such as SFP-00GI-25 AR (tradename; manufactured by Nippon Steel Chemical Co., Ltd.) are also usable.

In the wet etching of the insulating layer in the present invention, in many cases, concaves and convexes such as wiring of the conductive inorganic material layer are formed on the surface of the insulating layer. In this case, the thickness of the dry film resist is preferably 1.1 to 5 times the thickness of the conductive inorganic material layer. When the thickness of the dry film resist is less than 1.1 times the thickness of the conductive inorganic material layer, after the lamination of the dry film resist, there is a fear of convexes of the substrate breaking through the dry film resist and consequently being exposed. This is causative of a poor etching shape. The upper limit of the thickness of the dry film resist is preferably 5 times the thickness of the conductive inorganic material layer on the insulating layer from the viewpoints of stabilization of the pattern shape and resolution of a fine pattern. In short, a good pattern shape can be obtained when the thickness of the dry film resist is in the range of 1.1 to 5 times the thickness of the conductive inorganic material layer located on the side in which a pattern is to be formed by the dry film resist.

In general, the aspect ratio of the commercially available dry film resist is about 2 to 1, and, when the formation of a fine wiring pattern is contemplated, a smaller thickness of the dry film resist is more advantageous. Since, however, the above-described problem exists, the thickness of the dry film resist should be larger than the thickness of the conductive inorganic material layer provided in the laminate.

The lamination of the dry film resist can be carried out by roll pressing. In the laminate used in the present invention, since the inorganic material layer is patterned before patterning the insulating layer, the surface of the laminate has concaves and convexes. Therefore, when the lamination is carried out by roll pressing under the atmospheric pressure, air bubbles are included into portions of the edges of the concaves and convexes in the patterned inorganic material layer. The inclusion of air bubbles results in adhesion failure which in turn results in an unacceptable poor etching shape. Since the etching rate of the wet etching is several tens of times larger than the etching rate of plasma etching as the dry process, the contact failure is likely to cause etching of a site not to be etched. In this case, the pattern defect extends in a wider area than that in the case of dry process. To solve this problem, in the present invention, preferably, the lamination is carried out under reduced pressure or under vacuum, preferably at a vapor pressure of not more than 80 KPa (≈600 mmHg), more preferably not more than 40 KPa (≈300 mmHg), most preferably not more than 6.7 KPa (≈50 mmHg), from the viewpoint of removing air bubbles.

In the case of sheet-by-sheet processing, lamination by roll pressing causes warpage of the laminate which is causative of the lowered accuracy of alignment. On the other hand, in the case of processing in a continuous form in a continuous feed, continuous production line, since the tension is applied, the warpage of the laminate does not occur. However, after the lamination of the dry film resist, when the tension in the steps of exposure, development, and etching of the insulating layer is more than 30 kgf/cm, the laminate per se is deformed and, in this case, the above steps are carried out in such a state that the laminate is in a stretched state. This is likely to cause the separation of the resist and, in its turn, etching failure. When the tension is not less than 10 kgf/cm, the laminate is sometimes deformed with the progress of the wet etching of the insulating layer. For this reason, in each step, the tension applied to the laminate is further preferably not more than 10 kgf/cm.

The roll speed at the time of lamination by roll pressing is preferably in the range of 0.1 to 3.0 m/min. When the roll speed is below the above-defined range, the productivity is significantly lowered. On the other hand, when the roll speed is above the above-defined range, even under reduced pressure, for example, the inclusion of air bubbles or adhesion failure of the dry film occurs.

When a dry film resist with fine concaves and convexes formed on the surface thereof is laminated so that the concaves and convexes face the substrate side, the fine concaves and convexes constitute a passage for escape of air bubbles. This can prevent the occurrence of the above unfavorable phenomenon and is effective in removing air bubbles.

That is, when the dry film resist is laminated in a continuous form in a continuous feed, continuous treatment, roll pressing under reduced pressure is preferred for preparing products with high dimensional stability. In addition to this, preferably, the surface of the dry film resist has concaves and convexes.

Regarding the concaves and convexes provided on the surface of the dry film resist used in the present invention, preferably, the dry film resist has a surface roughness Rz in the range of 0.5 to 50 μm. The concaves and convexes may be formed by any method without particular limitation. For example, after bringing a photosensitive resin composition to a dry film resist by coating or molding, the dry film resist is embossed to form concaves and convexes. Alternatively, a method may be used wherein a photosensitive resin composition in a solution form is coated onto a film having concaves and convexes and the coating is dried to prepare a dry film resist with concaves and convexes formed thereon.

In the present invention, the dry film resist is preferably laminated under conditions of temperature 20 to 100° C. and press pressure 0.05 to 0.3 MPa (0.5 to 3 kgf/cm$^2$). In this case, regarding the atmosphere in the lamination, the lamination is preferably carried out under reduced pressure or under vacuum, preferably at a pressure of not more than 80 KPa (≈600 mmHg), more preferably not more than 40 KPa (≈300 mmHg), most preferably not more than 6.7 KPa (≈50 mmHg). Lamination conditions vary depending upon Tg of the dry film resist used, and the lamination is carried out at a temperature high enough to fully cover a portion between patterns of the conductive inorganic material layer. In this case, when the temperature is excessively high, the sensitivity at the time of exposure is unstable.

In the lamination of the dry film resist in treatment by continuous feed of a continuous or pseudo-continuous laminate to produce electronic components with high dimensional accuracy, two indispensable requirements are roll pressing under reduced pressure and a lamination speed in the range of 0.1 to 3.0 m/min.

In the present invention, the development and separation of the dry film resist are preferably carried out using a developing solution or a separation solution corresponding to the dry film resist used under recommendation conditions. However, the method for the development and separation of the dry film resist is not particularly limited. As described above, development with an aqueous solution, preferably a basic aqueous solution, particularly preferably an aqueous inorganic basic solution, is preferred from the viewpoint of waste treatment. The aqueous solution in the present invention may be a liquid composed mainly of water. Depending upon development and separation conditions, the aqueous solution may contain less than 50% by weight of an organic solvent such as an aliphatic alcohol, an aromatic alcohol, or an organic polar solvent. There is no particular limitation on the method for development, and examples of development methods include dipping, air spray, and submerged spray.

When the dry film resist is used in wet etching of the polyimide, since the etching liquid contains a highly reactive component in a high concentration, as compared with other cases, it is difficult for the dry film resist to maintain the pattern. To overcome this problem, the following method may be used. After the dry film resist is laminated followed by exposure and development to form a pattern, the assembly is heated. Alternatively, in the case of a negative-working dry film resist, an ionizing radiation, preferably ultraviolet light, is again applied. This method can strengthen the pattern of the dry film resist and can increase pattern shape retention time even upon contact with the etching liquid.

The heating is carried out at a temperature in the range of 30 to 200° C., preferably 70 to 150° C., and the treatment time is suitably in the range of 10 sec to 20 min. The treatment method is not particularly limited, and examples thereof include a method wherein the assembly is allowed to stand on a hot plate, a method wherein the assembly is placed in an oven, a method wherein the assembly is treated with hot air, and a method wherein an infrared heater is used.

When the pattern shape retention is improved by the application of ultraviolet light (electromagnetic radiation) after the formation of a resist pattern, the application of energy at not less than 5 mJ with the same wavelength as used in the pattern-wise exposure is preferred.

Etching Liquid

Various etching liquids as described in the column of "BACKGROUND ART," may be used as the etching liquid used in the present invention. The production process of an electronic component according to the present invention, however, aims at high productivity, low process cost (apparatus cost, maintenance cost, and waste treatment cost), and low toxicity. Therefore, the etching liquid preferably has low toxicity and high service life. Preferably, the etching liquid does not contain highly toxic hydrazine. However, hydrazine may be contained as an additive in an amount of not more than 10% by weight based on the etching liquid. When the content of hydrazine exceeds 10%, etching shape is likely to be unstable making it difficult to process control. As described in Japanese Patent Laid-Open No. 301981/1993, the behavior of hydrazine in etching is unstable, and a lower hydrazine content is preferred from the viewpoints of process control and working environment.

The etching liquid used in the present invention should have etching rate high enough to etch polyimide within the pattern shape retention time of the dry film resist. Specifically, a basic aqueous solution composed mainly of an inorganic alkali disclosed in Japanese Patent Laid-Open Nos. 97081/1998 and 195214/1998 is most preferred. The etching liquid usable in the present invention is basically an aqueous solution containing one of or a mixture of two or more of an inorganic alkali, an aliphatic amine (diamine), an aliphatic alcohol, and an aliphatic amino alcohol and, as an additive, urea or an organic polar solvent and preferably has a pH value of more than 9.

The etching treatment temperature is above the solidifying point or precipitation temperature of the etching liquid and below the boiling point of the etching liquid and, from the viewpoints of productivity and process control, is preferably 30 to 95° C., more preferably 50 to 90° C. In the case of an etching liquid containing a component which is volatile at the treatment temperature, treatment for a long period of time sometimes causes a change in composition of the etching liquid. Therefore, the treatment is preferably carried out at a temperature such that the evaporation of the components of the etching liquid can be minimized. This, however, is not essential.

The smaller the temperature profile within the etching bath, the better the results. The temperature profile is preferably within ±1° C., more preferably within ±0.5° C.

It has been experientially confirmed that, based on the mechanism of wet etching of polyimide, the etching rate exponentially increases with increasing the etching temperature. When the treatment is carried out under conditions which provide a higher etching rate, the dependency of the etching rate upon the temperature becomes larger. Therefore, when temperature profile exists within the etching bath, a variation in pattern accuracy within the plane of the substrate is large. This is particularly significant when the etching rate of the insulating layer is large. Therefore, the minimization of the temperature profile is effective for uniform processing.

Etching methods include dipping, air spray, submerged spray, and dipping+application of ultrasonic wave. In the case of air spray, however, components of the etching liquid are significantly evaporated making it difficult to perform the liquid control. Preferred are dipping or submerged spray. Submerged spray is preferred from the viewpoint of further reducing the taper angle of the etching shape.

When ultrasonic wave is applied to the etching liquid, conditions for the application of ultrasonic wave should be carefully set so as to avoid an unfavorable phenomenon such that, upon the application of ultrasonic wave, the dry film resist is partially separated and the etching shape becomes unacceptable.

The etching of the laminate may be carried out in such a state that the laminate vertically stands up or is horizontally placed. When the etching of the laminate is carried out in such a state that the laminate vertically stands up, upon the removal of the laminate from the etching bath after the completion of the etching, the etching liquid is easily removed and the loss of the etching liquid is small. On the other hand, when the etching of the laminate is carried out in such a state that the laminate is horizontally placed, laminates can be horizontally continuously carried and, thus, advantageously, this method is more suitable for mass production and, in addition, the temperature profile of the etching liquid is small.

If necessary, before etching, the surface of the laminate may be treated with a surfactant to enhance the affinity of the laminate for the etching liquid. When the etching liquid is composed mainly of an inorganic basic aqueous solution, the affinity of the etching liquid for the surface of the insulating layer is sometimes poor. In this case, the treatment with a surfactant is effective for improving the affinity of the laminate for the etching liquid to evenly etch the whole laminate. The type of the surfactant used for this purpose is not particularly limited. In the case of continuous large-scale treatment, however, since the surfactant is gradually incorporated into the etching solution, the use of an ionic surfactant leads to a fear of the surfactant functioning as a buffer and thus deteriorating the etching liquid. In this case, the use of a nonionic surfactant is preferred.

Further, after the treatment with an etching liquid, if necessary, the laminate may be rinsed. When rinsing is not carried out, components of the etching liquid or the residue of the etched insulating layer are unfavorably sometimes left on the surface of the substrate. Rinsing liquids usable for the rinsing treatment include, but are not limited to: a basic aqueous solution; a mixed solution composed of an organic polar solvent and water; a mixed solution composed of an organic polar solvent and an alcohol; and water. The rinsing treatment temperature may be in any temperature range so far as the temperature is above the solidifying point or precipitation point of the rinsing liquid used and below the boiling point of the rinsing liquid. In this case, the separation liquid in the step of separating the dry film resist after the step of etching as such may be used as the rinsing liquid to simultaneously carry out the rising treatment and the separation of the dry film resist.

Organic polar solvents usable in the rinsing liquid include, but are not limited to, n-methyl-2-pyrrolidone (NMP), dimethylformamide, and dimethyl acetamide. Alcohols usable in the rinsing liquid include: aliphatic alcohols such as methanol, ethanol, and propanol; aromatic alcohols such as phenol and cresol; and compounds containing a plurality of hydroxyl groups in one molecule, such as diols.

Separation of Dry Film Resist

The dry film resist is separated under recommendation conditions for the separation of the dry film resist. The use of an inorganic basic aqueous solution is preferred, for example, from the viewpoint of waste liquid treatment. When the polyimide or the like as the insulating layer used has poor alkali resistance, the use of an aqueous solution of an organic base such as ethanolamine is preferred. The dry film resist is in many cases separated by spraying a basic aqueous solution in air. Alternatively, dipping or application of ultrasonic wave may be used.

In the case of a laminate produced by hot pressing, in many cases, the surface of the conductive inorganic material layer in the laminate has been roughened for adhesion improvement purposes. When the roughened face has been transferred onto the insulating layer, the dry film resist is embedded in the roughened face. Therefore, severer conditions than usually required conditions should be adopted. This is true of the case where the treatment for improving the resistance to the etching liquid has been carried out.

EXAMPLES

Wet Etchable Laminate

[Etchability Test]

For the production of a sample for the formation of an insulating layer, PAA-A (tradename; polyamic acid varnish manufactured by Mitsui Chemicals Inc.) and EN-20 (tradename; polyimide varnish manufactured by New Japan Chemical Co., Ltd.) were provided as an adhesive resin. APIKAL NPI (tradename; polyimide film (thickness 12.5 $\mu$m) manufactured by Kanegafuchi Chemical Ind. Co., Ltd.) was provided as a low-expansion polyimide to be functioned as a core. An alkali-amine polyimide etching liquid TPE-3000 (tradename; manufactured by Toray Engineering Co., Ltd.) was provided as an etching liquid used in the etching test.

The adhesive resin varnish EN-20 (tradename) was spin coated to a film thickness of 20 to 40 $\mu$m onto a 100 $\mu$m-thick SUS 304 plate having a size of 15 cm×15 cm, and the coating was dried in an oven at 180° C. for 30 min. PAA-A (tradename) was an amic acid varnish, and, after the solvent was removed in the step of drying at 120° C. for 15 min, the amic acid varnish was thermally imidated by a predetermined procedure to form a polyimide. Each dried product was taken off into a size of about 1.5 cm in length×about 2 cm in width. The center portion was cut with a cutter knife, and the film thickness was then measured as an initial film thickness with a tracer type film thickness meter Dektak 16000 (tradename; manufactured by Sloan Technology). Thereafter, the samples were immersed in a polyimide etching liquid TPE-3000 (tradename; manufactured by Toray Engineering Co., Ltd.), which had been kept at 70° C. and had been stirred with a magnetic stirrer to such an extent that a whirlpool was formed, and the film thickness was measured with a tracer type film thickness meter Dektak 16000 (tradename; manufactured by Sloan Technology) for each immersion time in substantially the same place as that where the initial film thickness was measured. The film thickness after immersion was subtracted from the initial film thickness to determine a reduction level of film thickness, and the reduction level of the film thickness per min was regarded as the etching rate (unit: $\mu$m/min). The results are shown in Table 1 below.

TABLE 1

| Sample | Etching rate, μm/min |
| --- | --- |
| EN-20 | About 11 μm/min |
| PAA-A | About 1 μm/min |
| APIKAL NPI | About 20 μm/min |

[Evaluation of Etchability]

EN-20 (tradename; polyimide varnish manufactured by New Japan Chemical Co., Ltd.) was coated on both sides of a 12.5 μm-thick polyimide film APIKAL NPI film (tradename; manufactured by Kanegafuchi Chemical Ind. Co., Ltd.) to a film thickness of 1.5 μm±0.3 μm on a dry basis, and the coatings were dried under the above-described drying conditions. The film thus obtained was designated as a film A with an adhesive layer.

Likewise, PAA-A (tradename; manufactured by Mitsui Chemicals Inc.) was coated on both sides of a 12.5 μm-thick APIKAL NPI film (tradename; manufactured by Kanegafuchi Chemical Ind. Co., Ltd.) to form a film which was designated as a film B with an adhesive layer. For the films A and B with an adhesive layer, the etching rate ratio is shown in Table 2 below.

TABLE 2

| | Etching rate | | Thickness of low-expansion layer: | |
| --- | --- | --- | --- | --- |
| | Low-expansion layer | Adhesive layer | total thickness of adhesive layer | Etching rate ratio |
| Film A with adhesive layer | About 20 μm/min | About 11 μm/min | 5:2 | 20:11 |
| Film B with adhesive layer | About 20 μm/min | About 1 μm/min | 5:2 | 20:1 |

Each of the films A and B with an adhesive layer was sandwiched between a 20 μm-thick SUS 304 HTA foil (tradename; manufactured by Nippon Steel Corp.) and a 18 μm-thick (Rz=1.5 μm) copper alloy foil C 7025 (tradename; manufactured by Olin Corp.), followed by vacuum pressing under conditions of pressure 20 kg/cm$^2$, 270° C. and 10 min to prepare two three-layer materials having a layer construction of SUS:insulating layer:copper. The laminates thus obtained were designated as a laminate A and a laminate B.

[Evaluation of Etching of Insulating Layer]

Each of the laminates A and B with the SUS side being masked prepared in the above step was immersed in a ferric chloride solution to etch the copper foil. Thereafter, the laminates were dried, were cut into a suitable size, and were then immersed in an etching liquid TPE-3000 (tradename; manufactured by Toray Engineering Co., Ltd.) which had been stirred at 70° C. with a magnetic stirrer to such an extent that a whirlpool was formed. At the time when the polyimide film was fully removed to expose the surface of SUS, the laminates were taken out of the etching liquid. Thus, the insulating layer was wet etched.

Likewise, the insulating layer was subjected to plasma treatment under conditions of pressure 25 to 30 Pa, process gas $NF_3/O_2$=10/90%, and frequency 40 kHz to etch the insulating layer.

Etching was continued until, when the laminate was visually inspected, the polyamide layer no longer existed on SUS. The thickness of the insulating layer was divided by the time necessary for the etching to determine the etching rate. The results are shown in Table 3 below.

TABLE 3

| | Etching rate, μm/min | |
| --- | --- | --- |
| | Wet etching | Plasma etching |
| Laminate A | 12 | 0.2 |
| Laminate B | 2 | 0.2 |

As is apparent from Table 3, the etching rate in the wet etching is larger than that in the plasma etching, and, in the wet etching, the insulating layer can be etched in a very short time.

[Patterning of Conductive Inorganic Material Layer]

A 50 μm-thick basic aqueous solution development-type dry film resist was laminated by a hot roll laminator onto both sides of the laminated A prepared in the test in the evaluation of etchability having a size of 300 mm×300 mm, that is, onto the stainless steel layer and onto the copper alloy foil layer at a speed of 0.5 m/min under conditions of roll surface temperature 105° C. and line pressure 2 to 4 kg/cm, and the laminate was then allowed to stand at room temperature for 15 min. At that time, since the stainless steel layer and the copper alloy foil layer were respectively provided on both sides of the laminate, and, after the lamination of the dry film resist, the laminate was flat and there was no warpage. Thereafter, exposure was carried out using a predetermined mask by means of a vacuum intimate contact exposure system at 100 mJ/cm$^2$. After standing at room temperature for 15 min, the dry film resist was developed with a 1 wt % aqueous $Na_2CO_3$ solution under conditions of temperature 30° C. and spray pressure 2 kg/cm$^2$ for 60 sec to form a resist pattern.

Thereafter, the stainless steel layer and the copper foil layer were simultaneously etched with an aqueous ferric chloride solution. The dry film resist was then separated with an 3 wt % aqueous NaOH solution of 50° C. at a spray pressure of 1 kg/cm$^2$ to pattern the conductive inorganic material layer in the laminate A. Thus, the laminate A, wherein the stainless steel layer and the copper alloy layer have been patterned to partially expose the insulating layer, was prepared.

[Selection of Dry Film Resist]

The laminate A with the exposed insulating layer prepared in the above step was treated as follows. The laminate A with a mask provided on the SUS side was immersed in a ferric chloride solution to etch the copper foil. The following aqueous solution development-type dry film resist was laminated by means of a hot roll laminator under conditions of speed 0.5 m/min, roll surface temperature 105° C., and line pressure 2 to 4 kg/cm onto the exposed adhesive layer surface, and the laminate was then allowed to stand at room temperature for 15 min. Thereafter, a stripe mask having a line & space pattern of 500 μm/500 μm and 80 μm/80 μm was brought into intimate contact with the sample, and one side of the laminate was exposed by means of a parallel light intimate contact exposure system manufactured by ORC at an exposure of 30 to 200 mJ which is a recommended exposure range for the dry film. Thereafter, the sample was turned over, the same mask was brought into intimate contact with the other side of the laminate, followed by exposure. After standing at room temperature for 15 min, the dry film resist was developed with a 1 wt % aqueous $Na_2CO_3$ solution under conditions of temperature 30° C. and spray pressure 2 kg/cm$^2$ for 60 sec. Thereafter, the laminate was dried and was immersed in an etching liquid TPE-3000

(tradename; manufactured by Toray Engineering Co., Ltd.) which had been stirred at 70° C. with a magnetic stirrer to such an extent that a whirlpool had been formed. For the samples which had been immersed for varied immersion times, the dry film resist was separated with a 3 wt % aqueous NaOH solution at 50° C. at a spray pressure of 1 kg/cm$^2$. In this way, the insulating layer was wet etched into a desired shape. SUNFORT AQ-1558 (tradename), SUNFORT AQ-2058 (tradename), SUNFORT AQ-2538 (tradename), SUNFORT AQ-3038 (tradename), SUNFORT AQ-4038 (tradename), and SUNFORT AQ-5038 (tradename), manufactured by Asahi Kasei Kogyo K.K.; NPE 538 (tradename) and NPE 342 (tradename), manufactured by Nichigo-Morton Co., Ltd.; and SFP-00GI-25-AR (tradename), manufactured by Nippon Steel Chemical Co., Ltd. were used as the dry film resist. In this case, for the development of SFP-00GI-25-AR (tradename), a designated aqueous lactic acid solution was used.

For each sample, the dimension of the upper part of the stripe pattern was measured, and the point, at which the dimensional change was rapid, was regarded, for convenience, as the dry film resist pattern separation or dissolution time, and the time length up to this time was regarded as the pattern shape retention time of the dry film resist.

For each sample, the pattern retention time is shown in Table 4 below.

TABLE 4

| Sample | Thickness, μm | Pattern shape retention time |
|---|---|---|
| AQ-1558 | 15 | 1 min |
| AQ-2058 | 20 | 2 min |
| AQ-2538 | 25 | 5 min |
| AQ-3038 | 30 | 6 min |
| AQ-4038 | 40 | 8 min |
| AQ-5038 | 50 | 10 min |
| NPE 538 | 38 | 6 min |
| NPE 342 | 42 | 8 min |
| SFP00-GI-25 AR | 25 | 4 min |

As is apparent from Table 4, SUNFORT AQ-5038 (tradename), manufactured by Asahi Kasei Kogyo K.K. and NPE 342 (tradename), manufactured by Nichigo-Morton Co., Ltd. had relatively excellent resistance to etching liquid. SUNFORT AQ-2538 to SUNFORT AQ-5038 (tradename), manufactured by Asahi Kasei Kogyo K.K. were dry film resists which were identical to one another in composition and were different from one another only in thickness wherein the thickness of the dry film resist increased with increasing the sample number. As is apparent from Table 4, the pattern shape retention time increased with increasing the thickness of the dry film resist, indicating that the resistance to etching liquid also improved with increasing the thickness.

Pattern Reinforcement Treatment

After patterning the dry film resist, the following post treatment was carried out to impart further resistance of the dry film resist to etching liquid. The laminate A, from which the whole copper alloy foil had been removed in the above step, was used as the sample, and SUNFORT AQ-5038 (tradename), manufactured by Asahi Kasei Kogyo K.K. was used after patterning into a stripe pattern of L/S=500 μm/500 μm and 80 μm/80 μm. The evaluation was carried out in the same manner as used in the selection of the dry film resist.

[Heat Treatment]

An aluminum foil was placed on a hot plate heated at 120° C., and the sample A was left to stand on the aluminum foil to determine the pattern shape retention time. In this case, the time was changed as shown in Table 5 below. The relationship between the treatment time and the pattern shape retention is shown in Table 5 below.

TABLE 5

| Treatment time | Pattern shape retention |
|---|---|
| 10 sec | 10.5 min |
| 30 sec | 12 min |
| 60 sec | 14 min |
| 300 sec | Not less than 20 min |

[Post Exposure Treatment]

Since the negative-working dry film resist was used, after the development, the resist pattern should be further reinforced. To this end, post exposure was carried out under the following conditions to determine the pattern shape retention time. The relationship between the exposure and the pattern shape retention is shown in Table 6 below.

TABLE 6

| Exposure (in terms of i-ray) | Pattern shape retention |
|---|---|
| 100 mJ | 10.5 min |
| 300 mJ | 12 min |
| 500 mJ | 13 min |

As is apparent from Tables 5 and 6, heating provided better pattern reinforcement. The post exposure, however, was also effective, although the effect was inferior to that attained by the heat treatment. The reinforcement method may be properly selected according to the electronic component required and the process. Further, also in a combination of these methods, the effect could be obtained. However, the contribution of the heat treatment effect was large, and the effect attained by the post exposure was not significant.

[Preparation of Dry Film Resist for Patterning of Insulating Layer]

Strictly speaking, an experiment on a continuous feed process using a continuous laminate sheet should be carried out. However, for convenience, a laminate of 300 mm×300 mm was used for simulation.

[Dry Film Resist]

The following basic aqueous solution development-basic aqueous solution separation-type negative-working dry film resists were provided: SUNFORT AQ-1558 (tradename; thickness 15 μm), SUNFORT AQ-2058 (tradename; thickness 20 μm), SUNFORT AQ-2538 (tradename; thickness 25 μm), SUNFORT AQ-3038 (tradename; thickness 30 μm), SUNFORT AQ-4038 (tradename; thickness 40 μm), and SUNFORT AQ-5038 (tradename; thickness 50 μm), manufactured by Asahi Kasei Kogyo K.K. and ALPHO NPE 538 (tradename; thickness 38 μm; embossed) and ALPHO NPE 342 (tradename; thickness 42 μm; embossed), manufactured by Nichigo-Morton Co., Ltd.

The above samples were rolled pressed (under reduced pressure in one case and under atmospheric pressure in the other case) by the following method to examine the appearance of the laminate A after the lamination of the dry film resist.

[Roll Pressing]

The laminate A was sandwiched between the dry film resists, followed by lamination by means of a hot roll laminator under conditions of speed 1.5 m/min, roll surface temperature 105° C., and line pressure 2 to 4 kg/cm.

Thereafter, the laminates thus obtained were left to stand at room temperature for 15 min. For all the laminated laminates, due to the form of the laminates, i.e. sheet form, when they were left to stand on a flat metal plate, both ends were lifted by about 1 to 2 cm, and the copper alloy foil was warped on the patterned side. For the samples which had been laminated under reduced pressure, the inclusion of air bubbles was not observed, whereas, for the samples which had been laminated under the atmospheric pressure, the inclusion of air bubbles was observed in various places of the end portion in which the copper alloy foil or stainless steel foil had been patterned.

The samples were inspected for whether or not the patterned stainless steel foil (thickness 20 μm) or the copper alloy foil (thickness 18 μm) was exposed from the surface of the dry film resist. As a result, when the thickness of the metal layer was identical to or smaller than the thickness of the dry film, the metal partially broke through the dry film and was exposed. The results of evaluation are shown in Table 7 below.

resist pattern for processing of an insulating layer was formed so as to overlap with the stainless steel layer and the copper alloy foil layer patterned on the insulating layer.

If the pattern for processing of the insulating layer is formed only on the region with the insulating layer being left, that is, is formed so as not to overlap the stainless steel layer and the copper alloy foil layer, the resist pattern would also be etched by wet etching. In this case, a space is formed between the pattern and the stainless steel layer or the copper alloy layer, and etching is carried out in that portion, possibly resulting in etching in the insulating layer in its portion not to be etched. In order to prevent this unfavorable phenomenon, the resist pattern for processing of the insulating layer was formed so as to overlap with the patterned stainless steel layer or the copper alloy layer on the insulating layer. In particular, when the line width of the stainless steel layer or the copper alloy layer is small, the formation of the resist pattern for processing of the insulating layer on the conductive inorganic material layer with a small line width is also advantageous in this point.

TABLE 7

| Sample | Thickness, μm | Embossing | Atm | Warpage | Inclusion of air bubbles | Exposure of metal layer SUS side | Exposure of metal layer Copper side | Overall evaluation |
|---|---|---|---|---|---|---|---|---|
| AQ-1558 | 15 | Not done | Atmospheric pressure | X | X | X | X | X |
|  |  |  | Reduced pressure | X | ○ | X | X | X |
| AQ-2058 | 20 | Not done | Atmospheric pressure | X | X | X | ○ | X |
|  |  |  | Reduced pressure | X | ○ | X | ○ | X |
| AQ-2538 | 25 | Not done | Atmospheric pressure | X | X | ○ | ○ | X |
|  |  |  | Reduced pressure | X | ○ | ○ | ○ | Δ |
| AQ-3038 | 30 | Not done | Atmospheric pressure | X | X | ○ | ○ | X |
|  |  |  | Reduced pressure | X | ○ | ○ | ○ | Δ |
| AQ-4038 | 40 | Not done | Atmospheric pressure | X | X | ○ | ○ | X |
|  |  |  | Reduced pressure | X | ○ | ○ | ○ | Δ |
| AQ-5038 | 50 | Not done | Atmospheric pressure | X | X | ○ | ○ | X |
|  |  |  | Reduced pressure | X | ○ | ○ | ○ | Δ |
| NPE 538 | 38 | Done | Atmospheric pressure | X | X | ○ | ○ | X |
|  |  |  | Reduced pressure | X | ○ | ○ | ○ | Δ |
| NPE 342 | 42 | Done | Atmospheric pressure | X | X | ○ | ○ | X |
|  |  |  | Reduced pressure | X | ○ | ○ | ○ | Δ |

Warpage = ○: not warped, X: warped; Air bubbles = ○: not included, X: included; Exposure of metal layer = ○: not exposed, X: exposed For the materials of which the overall evaluation in the above table was Δ, i.e., the materials where, although the warpage occurred, neither the inclusion of air bubbles nor the exposure of the metal occurred, the laminate A with a stainless steel sheet having a width of 300 mm and a length of 20 m being connected to both ends thereof was provided to prepare a pseudo continuous sample. This sample was laminated by means of a vacuum roll laminator, and the laminate thus prepared as such was exposed and developed to etch the insulating layer. In the continuous processing of the continuous product, the problem of the warpage of the sheet after the lamination experienced in the processing of the laminate sheet did not occur, and good etching could be realized. In this case, bringing the tension to not less than 10 kgf/cm caused the deformation of the laminate with the progress of the wet etching of the insulating layer, and a tension of not less than 30 kgf/cm caused the deformation of the laminate per se.

[Exposure and Development]

For the laminate A, prepared in the above step, on which the dry film resist had been laminated, a mask pattern was put thereon, followed by exposure to i-ray at an exposure of 30 to 150 mJ/cm². Development was then carried out by spray development with 1 wt % $Na_2CO_3$ at 30° C. Thus, a In this case, the warped sample could not be brought into intimate contact with the mask at the time of exposure and was forcibly brought into intimate contact with the mask by suction. As a result, the alignment accuracy was inferior to other samples by about three to five times depending upon the warpage level.

[Wet Etching]

The samples prepared by the above step were wet etched under the following conditions. In this case, the treatment of the dry film resist for improving the resistance to etching liquid was not carried out. Regarding conditions for wet etching, as pretreatment, the samples were immersed in a 0.5% aqueous solution of Surfynol 104 E (tradename) manufactured by Nissin Chemical Industry Co., Ltd. as a nonionic surfactant for 30 sec and were then passed through a submerged spray-type horizontal transfer-type etching apparatus. An etching liquid TPE-3000 manufactured by Toray Engineering Co., Ltd. was used as the etching liquid, and the treatment temperature was 80° C. For the samples, the time necessary for etching was about 70 to 90 sec although the time depends, for example, upon the etching rate of the polyimide layer to the etching liquid and the etching temperature.

In this case, for the samples in which the inclusion of air bubbles in the resist pattern was observed and the samples in which the stainless steel layer and the copper alloy foil layer had been exposed, etching into a desired shape could not be achieved in many sites. This failure is attributable to the fact that, since, in wet etching, the etching rate is very high, etching occurs even upon slight touch with the etching liquid. Therefore, when the etching pattern of the copper alloy foil layer is not completely covered by the dry film resist, the failure is likely to occur.

An electron microphotograph of the sample for which etching could be successfully carried out is shown in FIG. 2, and an electron microphotograph of the sample for which etching failure occurred is shown in FIG. 3. As is apparent from FIG. 3, the insulating layer of the polyimide in its portion around the base of the etching pattern of the copper alloy foil has been attacked. In FIG. 1(g), when the thickness of the dry film resist 5 is less than 1.1 times than the thickness of the conductive inorganic material layer 3 or 2, this failure occurs in the base of the conductive inorganic material layer 3 or 2 in its portion around the insulating layer 1.

[Post Treatment of Wet Etching]

For the sample in which SUNFORT AQ-5038 (tradename) manufactured by Asahi Kasei Kogyo K.K. was laminated onto the laminate A followed by wet etching of the insulating layer, the sample was taken out of the etching bath and was then rinsed by a method wherein the sample was immersed in a vat filled with a rinse bath having the following composition for 30 sec and the vat was swung. When the rinse treatment is not carried out, the residue of the etched polyimide, etching liquid or the like is left on the surface and deteriorates the appearance. In this case, the liquid for separation in the step of separating the dry film resist as such may be used for rinsing to simultaneously carry out the step of rinsing and the step of dry film separation.

In Table 8 below, "without rinsing" is such that the sample was allowed to stand after taking out the sample from the etching liquid.

TABLE 8

| Rinsing liquid | Liquid temp. | Evaluation result |
| --- | --- | --- |
| Not rinsed | — | X |
| $H_2O$ | 25° C. | ○ |
| $H_2O$ | 50° C. | ○ |
| $H_2O$ | 75° C. | ○ |
| 3 wt % aq. KOH soln. | 25° C. | ○ |
| 3 wt % aq. KOH soln. | 50° C. | ○ |
| 3 wt % aq. KOH soln. | 75° C. | ○ |
| $H_2O$:NMP = 2:1 | 25° C. | ○ |
| $H_2O$:NMP = 2:1 | 50° C. | ○ |
| $H_2O$:NMP = 2:1 | 75° C. | ○ |
| IPA:NMP = 2:1 | 25° C. | ○ |
| IPA:NMP = 2:1 | 50° C. | ○ |
| IPA:NMP = 2:1 | 75° C. | ○ |

* NMP = n-methyl-2-pyrrolidone, IPA = isopropanol
○: residue absent, X: residue present

[Separation]

A high-temperature basic aqueous solution having a sodium hydroxide concentration of 3% by weight was sprayed at 50° C. against the dry film resist used in the patterning of the insulating layer to separate the dry film resist from the laminate. When the insulating layer was formed of a polyimide or the like having poor alkali resistance, the use of an organic basic aqueous solution such as ethanolamine is preferred.

[Pickling, Rust Preventive Treatment, Gold Plating, and Solder Printing]

A gold plating as finishing was applied to the patterned copper alloy foil layer in the wireless suspension blank for HDD formed by the above method. The gold plating was carried out to a thickness of 1 μm using a gold cyanide plating bath, Temperesist EX (tradename) manufactured by Japan Pure Chemical Co., Ltd. under conditions of 65° C., current density Dk=0.4 A/dm$^2$, and energization time about 4 min.

For the samples thus prepared, various properties were evaluated. As a result, for the samples in which there was warpage in such a state that the dry film resist was laminated, the alignment accuracy was poor, and, for the samples in which the inclusion of air bubbles was observed and the samples in which the patterned stainless steel foil or the copper alloy foil was exposed from the dry film resist, there was etching shape failure.

According to the present invention, since the conductive inorganic material layer is patterned by wet etching followed by patterning of the insulating layer by wet etching, short-time etching is possible as compared with dry etching, contributing to higher productivity. In particular, in products, such as suspensions for a hard disk drive, wherein the area of the insulating layer to be removed by etching is large and, at the same time, a fine pattern is necessary, a great effect can be attained by the application of wet etching. Therefore, a production process can be realized wherein the workability is better and the reject ratio is lower.

Further, high accuracy patterning is required of electronic components such as suspensions for a hard disk drive. In the prior art technique, however, for a non-rigid substrate for preparing a suspension for a hard disk drive or the like, it is difficult to coat the liquid resist to bring the resist film to an even thickness with high accuracy, and very close control is necessary in the step of coating and drying, and, thus, the non-rigid substrate was unsuitable for fine etching. Since, however, in the present invention, the insulating layer is patterned using a dry film resist, the use of a dry film having an originally constant film thickness is advantageous in that the process control is easy for the formation of the resist and the resist film is suitable for fine etching.

Further, according to the production process of an electronic component according to the present invention, a dry film is laminated by roll pressing under reduced pressure onto a laminate of which the conductive inorganic material layer has been patterned. By virtue of this construction, the warpage and the inclusion of air bubbles after the lamination of the dry film resist onto the continuous laminate sheet can be prevented.

Furthermore, according to the production process of an electronic component according to the present invention, the step of wet etching a continuous or pseudo-continuous laminate sheet can be carried out in a continuous feed, continuous production line. Therefore, electronic components can be produced with high accuracy, and the productivity can be significantly enhanced.

In wet etching, when the electronic component of the present invention is produced using a dry film resist having on its surface fine concaves and convexes, the fine concaves and convexes function as the place for escape of air bubbles and, even when the dry film resist is laminated, the inclusion of air bubbles can be prevented, contributing to improved resistance of the laminate to etching.

In the production process of the electronic component according to the present invention, the laminate of the dry film resist can be developed with a basic aqueous solution, and the separation of the dry film resist with the basic aqueous solution can be carried out. Therefore, the production process is advantageous in that the necessity of using a toxic material such as hydrazine can be eliminated and, at the same time, the use of an organic solvent, which poses a problem of waste, can be avoided.

In the production process of an electronic component according to the present invention, when the laminate of the dry film resist is exposed and developed to perform patterning followed by treatment selected from ultraviolet light irradiation treatment, heat treatment, and a combination of ultraviolet light irradiation treatment with heat treatment, the resistance of the dry film resist to the etchant for the insulating layer can be improved.

According to the present invention, when the time necessary for wet etching for the insulating layer is 10 sec to 30 min, preferably 10 sec to 15 min, more preferably 10 sec to 5 min, even etching with a strongly basic aqueous solution as an etching liquid does not cause the separation of the dry film resist during etching, and wet etching with high accuracy can be realized.

When a dry film resist having a thickness which is 1.1 to 5 times that of the level of concaves and convexes on the surface of the laminate is used, there is no possibility that, after the lamination of the dry film resist, the convex of the laminate breaks through the dry film resist and is exposed. As a result, a good etching pattern shape can be formed.

What is claimed is:

1. A process for producing an electronic component, comprising the steps of: wet etching a laminate of conductive inorganic material layer—insulating layer—conductive inorganic material layer or a laminate of conductive inorganic material layer—insulating layer to pattern the conductive inorganic material layer; and then performing wet etching to pattern the insulating layer, wherein the insulating layer in the laminate is wet etchable and has a single-layer structure or a laminate structure of two or more insulation unit layers, after the patterning of the conductive inorganic material layer in the laminate, the patterning of the insulating layer by wet etching is carried out in a continuous form in a continuous feed, continuous production line using a dry film resist, and in patterning the insulating layer using the dry film resist, the dry film resist is laminated by roll pressing onto the laminate under a reduced pressure of not more than 80 KPa.

2. The process according to claim 1, wherein the roll speed at the time of lamination by the roll pressing is 0.1 to 3.0 m/min.

3. The process according to claim 1, wherein the surface of the dry film resist has fine concaves and convexes.

4. The process according to claim 3, wherein the fine concaves and convexes are provided by embossing.

5. The process according to claim 1, wherein the dry film resist can be developed with an aqueous solution and can be separated with an aqueous solution.

6. The process according to claim 5, wherein the aqueous solution is a basic aqueous solution.

7. The process according to claim 1, wherein the wet etching of the laminate after the patterning of the conductive inorganic material layer is carried out by a method which comprises the steps of:

subjecting the laminate with the dry film resist laminated thereon to exposure and development to perform patterning; and then performing treatment selected from ultraviolet light irradiation treatment, heat treatment, and a combination of ultraviolet light irradiation treatment with heat treatment to improve the resistance of the dry film resist to an etchant for the insulating layer.

8. The process according to claim 1, wherein a tension of not more than 30 kgf/cm is applied to the laminate in the continuous form in the continuous feed, continuous production line.

9. The process according to claim 1, wherein the thickness of the dry film resist is 1.1 to 5 times that of one conductive inorganic material layer in the laminate as the starting material.

10. The process according to claim 1, wherein the time necessary for wet etching of the insulating layer is not less than 10 sec and not more than 30 min.

11. The process according to claim 1, wherein the temperature in the wet etching of the insulating layer is not less than 10° C. and not more than 120° C.

12. The process according to claim 1, wherein the single-layer structure or all the two or more insulation unit layers in the insulating layer are formed of an organic material.

13. The process according to claim 1, wherein the single-layer structure or at least one layer in the two or more insulation unit layers in the insulating layer is formed of a polyimide resin.

14. The process according to claim 1, wherein the single-layer structure or at least one layer in the two or more insulation unit layers in the insulating layer is formed of an inorganic material.

15. The process according to claim 1, wherein the single-layer structure or at least one layer in the two or more insulation unit layers in the insulating layer is formed of a composite comprised of an organic material and an inorganic material.

16. The process according to claim 1, wherein the single-layer structure or all the layers in the two or more insulation unit layers in the insulating layer is formed of a polyimide resin.

17. The process according to claim 1, wherein the single-layer structure or at least one layer in the two or more insulation unit layers in the insulating layer is formed of a low-expansion polyimide having a coefficient of linear thermal expansion of not more than 30 ppm.

18. The process according to claim 17, wherein the insulating layer has a layer construction of adhesive polyimide—low-expansion polyimide—adhesive polyimide.

19. The process according to claim 18, wherein the two adhesive polyimides in the insulating layer having the layer construction of adhesive polyimide—low-expansion polyimide—adhesive polyimide are different from each other in composition.

20. The process according to claim 1, wherein the insulating layer is etched with an etching liquid having a pH value of more than 9.

21. The process according to claim 1, wherein the single conductive inorganic material layer or both the two conductive inorganic material layers in the laminate are formed of copper or surface treated copper.

22. The process according to claim 1, wherein the single conductive inorganic material layer or both the two conductive inorganic material layers in the laminate are formed of a copper alloy or a surface treated copper alloy.

23. The process according to claim 1, wherein the single conductive inorganic material layer or both the two conductive inorganic material layers in the laminate are formed of stainless steel or surface treated stainless steel.

24. The process according to claim 1, wherein one of the two conductive inorganic material layers in the laminate is formed of stainless steel or surface treated stainless steel and the other is formed of copper alloy or surface treated copper alloy.

25. The process according to claim 1, wherein one of the two conductive inorganic material layers in the laminate is formed of stainless steel or surface treated stainless steel and the other is formed of copper or surface treated copper.

* * * * *